(12) United States Patent
Lee et al.

(10) Patent No.: US 7,679,137 B2
(45) Date of Patent: *Mar. 16, 2010

(54) METHOD FOR FABRICATING RECESSED GATE MOS TRANSISTOR DEVICE

(75) Inventors: Pei-Ing Lee, Chang-Hua Hsien (TW); Chien-Li Cheng, Hsin-Chu (TW); Shian-Jyh Lin, Taipei County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 130 days.

This patent is subject to a terminal disclaimer.

(21) Appl. No.: 11/696,163

(22) Filed: Apr. 3, 2007

(65) Prior Publication Data

US 2007/0246755 A1  Oct. 25, 2007

(30) Foreign Application Priority Data

Apr. 20, 2006  (TW)  ............... 95114100 A (51) Int. Cl.
*H01L 29/76* (2006.01)
*H01L 31/062* (2006.01)

(52) U.S. Cl. .................. 257/330; 257/332; 257/333; 438/243; 438/270

(58) Field of Classification Search .................. 257/330, 257/332–333, 328–329, E21.545, E21.548, 257/E21.55; 438/243, 270
See application file for complete search history.

(56) References Cited

U.S. PATENT DOCUMENTS

| 4,272,302 | A  |   | 6/1981  | Jhabvala |         |
|-----------|----|---|---------|----------|---------|
| 4,897,702 | A  |   | 1/1990  | Sunouchi |         |
| 4,979,004 | A  | * | 12/1990 | Esquivel et al. | 257/316 |
| 5,306,941 | A  |   | 4/1994  | Yoshida  |         |
| 6,355,529 | B2 |   | 3/2002  | Heo      |         |
| 6,476,444 | B1 | * | 11/2002 | Min      | 257/330 |
| 6,509,608 | B1 | * | 1/2003  | Hueting  | 257/330 |
| 6,852,597 | B2 | * | 2/2005  | Park et al. | 438/268 |
| 7,316,952 | B2 |   | 1/2008  | Lee      |         |
| 2002/0094622 | A1 |   | 7/2002 | Sneelal |         |
| 2005/0208722 | A1 |   | 9/2005 | Peake   |         |
| 2006/0270149 | A1 | * | 11/2006 | Lee    | 438/243 |
| 2007/0138545 | A1 | * | 6/2007  | Lin et al. | 257/330 |
| 2008/0135907 | A1 | * | 6/2008  | Lin et al. | 257/302 |

FOREIGN PATENT DOCUMENTS

CN  1873948 A  12/2006

* cited by examiner

*Primary Examiner*—Theresa T Doan
(74) *Attorney, Agent, or Firm*—Winston Hsu (57) ABSTRACT

A method of fabricating self-aligned gate trench utilizing TTO poly spacer is disclosed. A semiconductor substrate having thereon a pad oxide layer and pad nitride layer is provided. A plurality of trench capacitors are embedded in a memory array region of the semiconductor substrate. Each of the trench capacitors has a trench top oxide (TTO) that extrudes from a main surface of the semiconductor substrate. Poly spacers are formed on two opposite sides of the extruding TTO and are used, after oxidized, as an etching hard mask for etching a recessed gate trench in close proximity to the trench capacitor.

3 Claims, 15 Drawing Sheets

METHOD FOR FABRICATING RECESSED GATE MOS TRANSISTOR DEVICE

BACKGROUND OF THE INVENTION

1. Field of the Invention

The present invention relates generally to a method for fabricating semiconductor devices. More specifically, the present invention relates to a self-aligned method for making recessed gate of a Metal-Oxide-Semiconductor (MOS) transistor device.

2. Description of the Prior Art

Integrated circuit devices are continually being made smaller in order to increase speed, make the device more portable and to reduce the cost of manufacturing the device. However, certain designs have a minimum feature size, which cannot be reduced without compromising the integrity of electrical isolation between devices and consistent operation of the device. For example, dynamic random access memory devices (DRAMs), which use vertical metal oxide semiconductor field effect transistors (MOSFETs) with deep trench (DT) storage capacitors, have a minimum features size of approximately 70 nm~0.15 µm. Below that size, the internal electric fields exceed the upper limit for storage node leakage, which decreases retention time below an acceptable level. Therefore, there is a need for different methods and/or different structures to further reduce the size of integrated circuit devices.

With the continued reduction in device size, sub-micron scale MOS transistors have to overcome many technical challenges. As the MOS transistors become narrower, that is, their channel length decreases, problems such as junction leakage, source/drain breakdown voltage, and data retention time become more pronounced.

One solution to decrease the physical dimension of ULSI circuits is to form recessed gate or "trench-type" transistors, which have a gate electrode buried in a groove formed in a semiconductor substrate. This type of transistor reduces short channel effects by effectively lengthening the effective channel length by having the gate extend into the semiconductor substrate.

The recess-gate MOS transistor has a gate insulation layer formed on sidewalls and bottom surface of a recess etched into a substrate, a conductive filling the recess, contrary to a planar gate type transistor having a gate electrode formed on a planar surface of a substrate.

However, the aforesaid recessed-gate technology has some shortcomings. For example, the recess for accommodating the recessed gate of the MOS transistor is etched into a semiconductor wafer by using conventional dry etching methods. It is difficult to control the dry etching and form recesses having the same depth across the wafer. A threshold voltage control problem arises because of recess depth variation. Further, the variation of the channel width may result in insufficient drive current. Moreover, an additional photo mask is required to define the prior art recess gate area. This causes variation of the source/drain landing area and increased contact resistance, and thus affects threshold voltage and drive current.

SUMMARY OF THE INVENTION

It is one object of this invention to provide a method of fabricating a self-aligned recess-gate MOS transistor device in order to solve the above-mentioned problems.

According to the claimed invention, a method for fabricating a recessed gate MOS transistor device is provided. A semiconductor substrate having a main surface is provided. A pad oxide layer is formed on the main surface. A plurality of trench devices are inlaid in the semiconductor substrate. Each of the trench devices is capped by a trench top layer. The trench top layer extrudes from the main surface. A lining layer is deposited over the semiconductor substrate. The lining layer covers the pad layer and the trench top layer. A silicon layer is deposited on the lining layer. The silicon layer is anisotropically etched to form a silicon spacer on sidewall of the trench top layer. A first tilt-angle ion implantation process is performed to implant dopants into the silicon spacer at one side of the trench top layer. A second tilt-angle ion implantation process is performed to implant dopants into the silicon spacer at the other side of the trench top layer. The silicon spacer that is not implanted is selectively removed to form a silicon hard mask on the sidewall of the trench top layer. The silicon hard mask oxidized to form an oxide spacer. Using the oxide spacer as an etching hard mask, the lining layer, the pad oxide layer and the semiconductor substrate are dry etched, thereby forming a self-aligned trench. A sacrificing oxide or deposited insulating layer is formed on interior surface of the trench. The trench is filled with a doped silicon layer. A thermal process is executed to drive dopant species of the doped silicon layer to diffuse into the semiconductor substrate, thereby forming a self-aligned diffusion region. The doped silicon layer and the sacrificing oxide layer are removed. A dielectric liner is formed on sidewall and bottom of the trench. A dry etching process is performed to etch through the dielectric liner at the bottom of the trench and then etching into the semiconductor substrate, thereby forming a gate trench that splits the diffusion region into a source diffusion region and a drain diffusion region. A gate oxide layer is formed on interior surface of the gate trench. A gate material layer is formed on the gate oxide layer.

The recess gate of this invention is formed by using a self-aligned masking method. The source/drain regions are formed by diffusion of P+ doped poly in a self-aligned fashion. These are distinct features of this invention.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
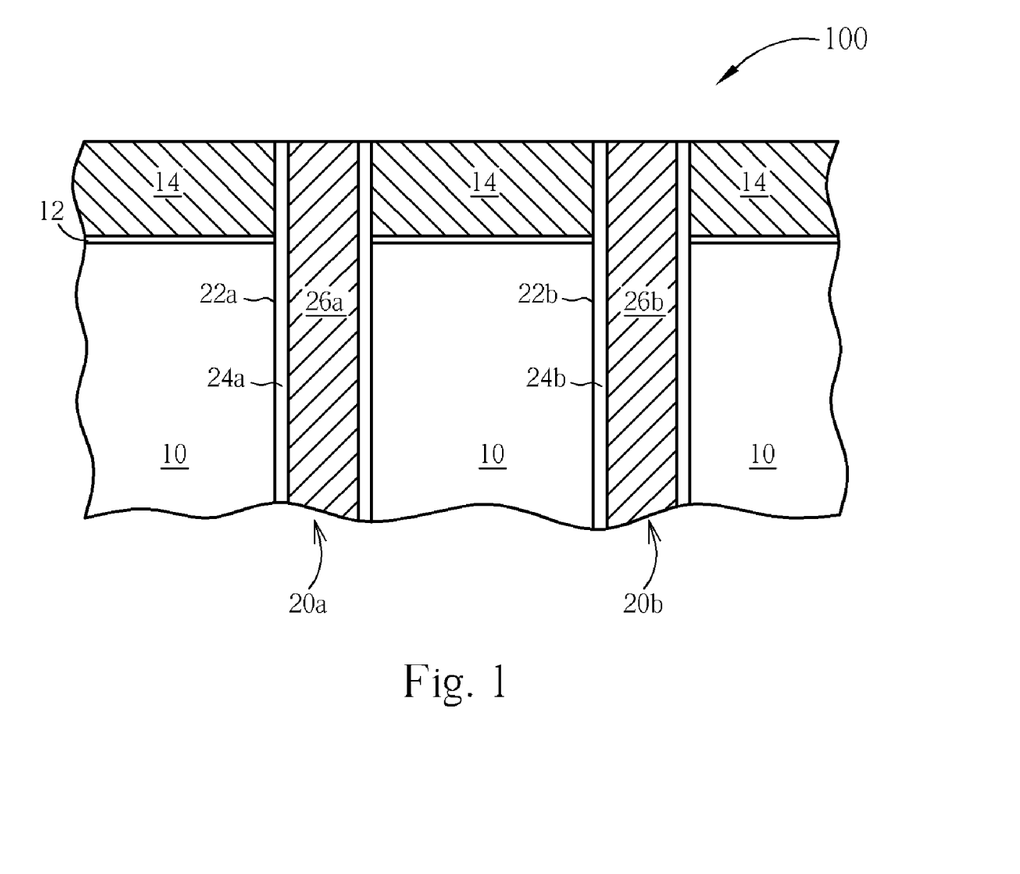
FIGS. 1-15 are schematic, cross-sectional diagrams illustrating a self-aligned method of fabricating a recessed-gate in accordance with one preferred embodiment of this invention.

Please refer to FIGS. 1-15. FIGS. 1-15 are schematic, cross-sectional diagrams illustrating a self-aligned method of fabricating a recessed-gate of MOS transistor devices utilizing a trench top oxide (TTO) spacer in accordance with one preferred embodiment of this invention. As shown in FIG. 1, a semiconductor substrate 10 such as a silicon substrate, silicon epitaxital substrate or Silicon-On-Insulator (SOI) substrate is provided. A pad oxide layer 12 is then deposited on the semiconductor substrate 10. A pad nitride layer 14 is then deposited on the pad oxide layer 12.

The pad oxide layer 12 may be formed by thermal oxidation methods or using chemical vapor deposition (CVD) methods. Typically, the pad oxide layer 12 has a thickness of about 10-500 angstroms. The pad nitride layer 14 may be formed by low-pressure CVD (LPCVD) or using any other suitable CVD methods. Preferably, the pad nitride layer 14 has a thickness of about 500-5000 angstroms.

Deep trench capacitors 20a and 20b are formed in deep trench 22a and deep trench 22b, respectively, within a memory array area 100 of the semiconductor substrate 10.

The deep trench capacitor 20a comprises a sidewall oxide dielectric layer 24a and a doped polysilicon 26a. The deep trench capacitor 20b comprises a sidewall oxide dielectric layer 24b and a doped polysilicon 26b. The doped polysilicon 26a and the doped polysilicon 26b function as one capacitor electrode of the deep trench capacitors 20a and 20b, respectively.

For the sake of simplicity, only the upper portions of the deep trench capacitors 20a and 20b are shown in figures. It is understood that the deep trench capacitors 20a and 20b further comprises a buried plate acting as the other capacitor electrode, which is not shown.

Figure 2:
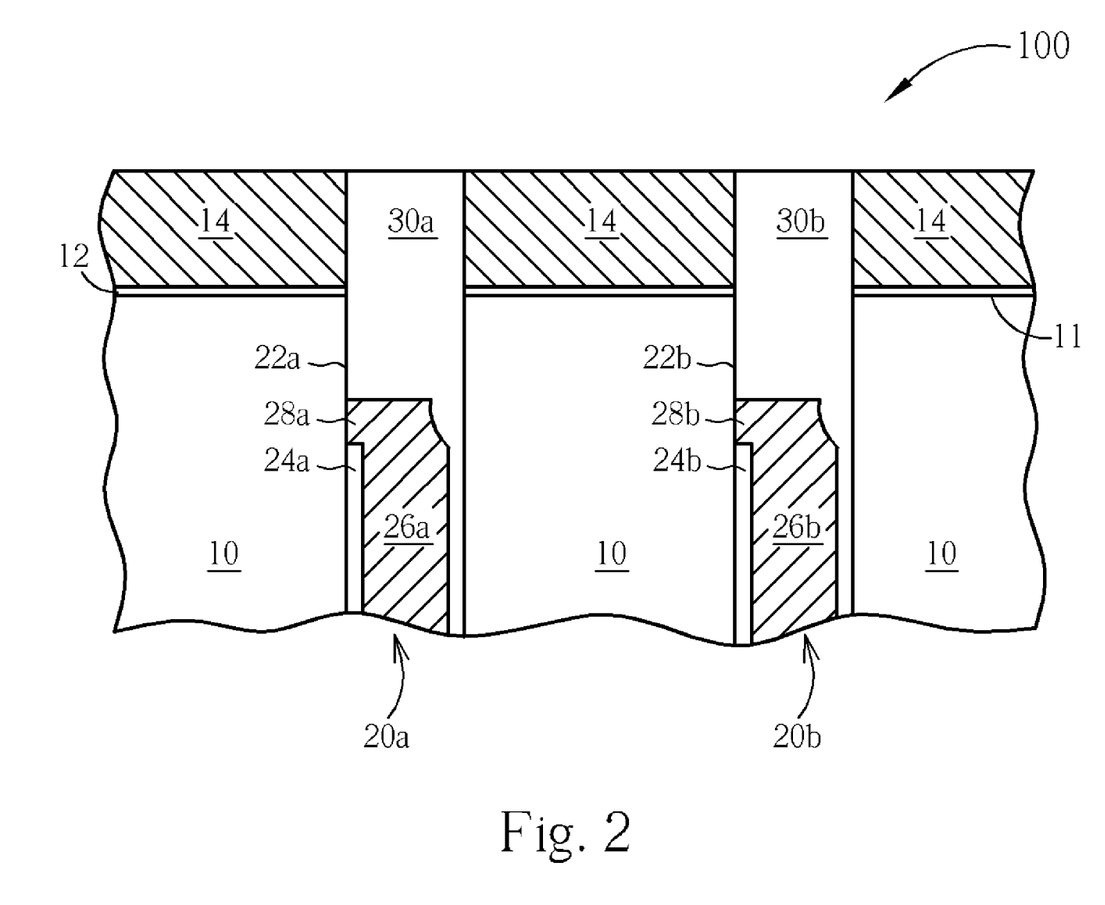

As shown in FIG. 2, a so-called Single-Sided Buried Strap (SSBS) process is carried out to form single-sided buried strap 28a and 28b on the deep trench capacitors 20a and 20b respectively. Subsequently, a Trench Top Oxide (TTO) layers 30a and 30b are formed to cap the single-sided buried strap 28a and 28b respectively. The TTO layers 30a and 30b extrude from a main surface 11 of the semiconductor substrate 10.

The aforesaid SSBS process generally comprises the steps of etching back the sidewall oxide dielectric layer and the doped polysilicon (or so-called Poly-2) 26a and 26b to a first depth; refilling the recess with another layer of polysilicon (or so-called Poly-3); etching back the Poly-3 to a second depth; forming an asymmetric spacer on interior sidewall of the recess; etching away the Poly-3 and Poly-2 that are not covered by the asymmetric spacer; filling the recess with TTO insulation layer; and chemical mechanical polishing the TTO insulation layer.

Figure 3:
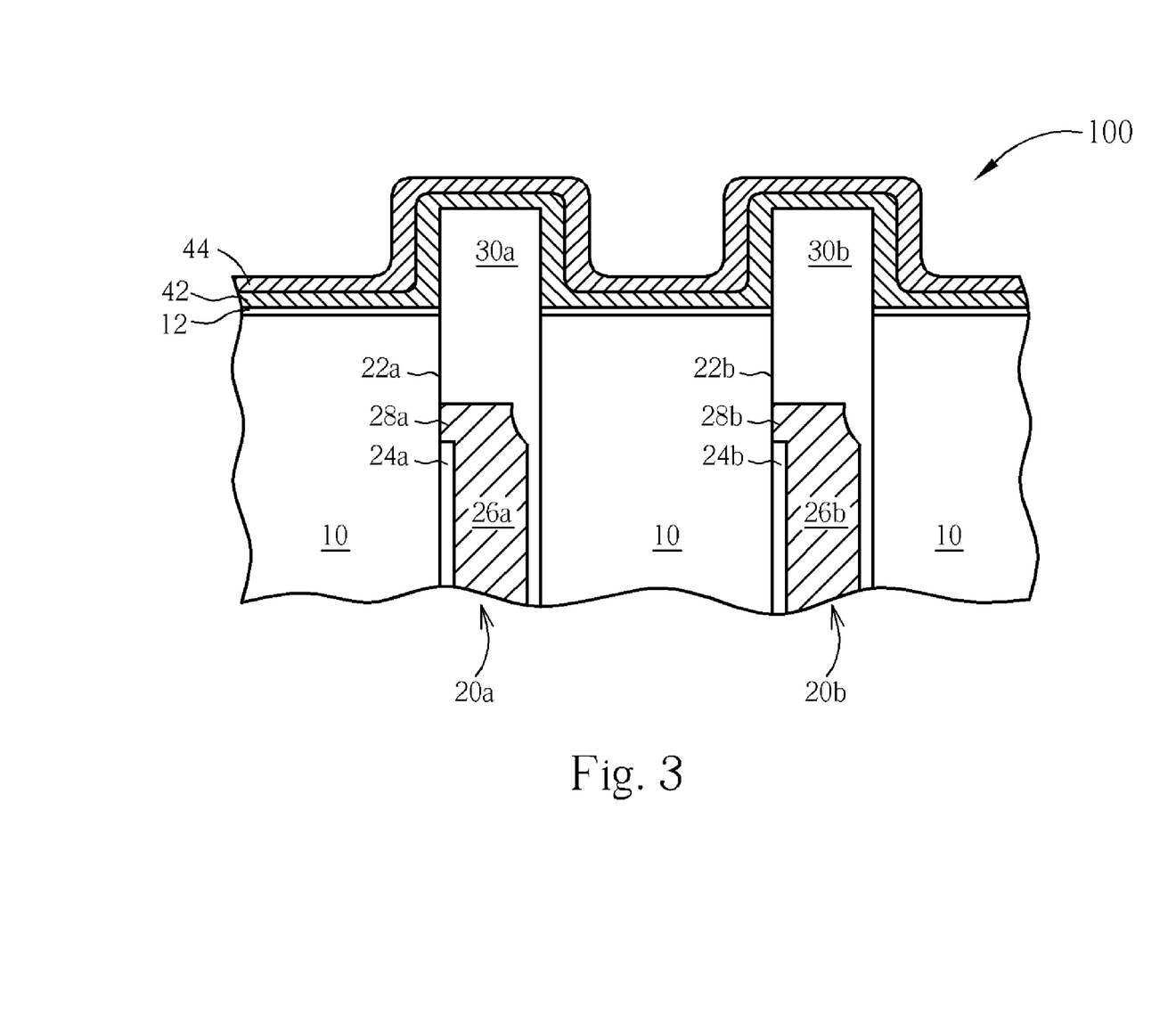

As shown in FIG. 3, after the formation of the SSBS 28a and 28b, the pad nitride layer 14 is stripped off by using methods known in the art, for example, wet etching solution such as heated phosphorus acid dipping, but not limited thereto.

A Chemical Vapor Deposition (CVD) process such as a Low-Pressure CVD (LPCVD) or Plasma-Enhanced CVD (PECVD) is carried out to deposit a conformal etching stop layer 42 on the semiconductor substrate 10 within the memory array area 100 and support circuit area 102. According to the preferred embodiment of this invention, the etching stop layer 42 comprises silicon nitride wherein the etching stop layer has thickness of about 50-500 angstroms, preferably 100-300 angstroms.

Another CVD process such as a LPCVD or PECVD is carried out to deposit a masking layer 44 on the etching stop layer 42. According to the preferred embodiment of this invention, the masking layer 44 has a thickness of about 50-500 angstroms, preferably 100-400 angstroms. Please note that the amorphous masking layer 44 can be replaced with a polysilicon layer.

Figure 4:
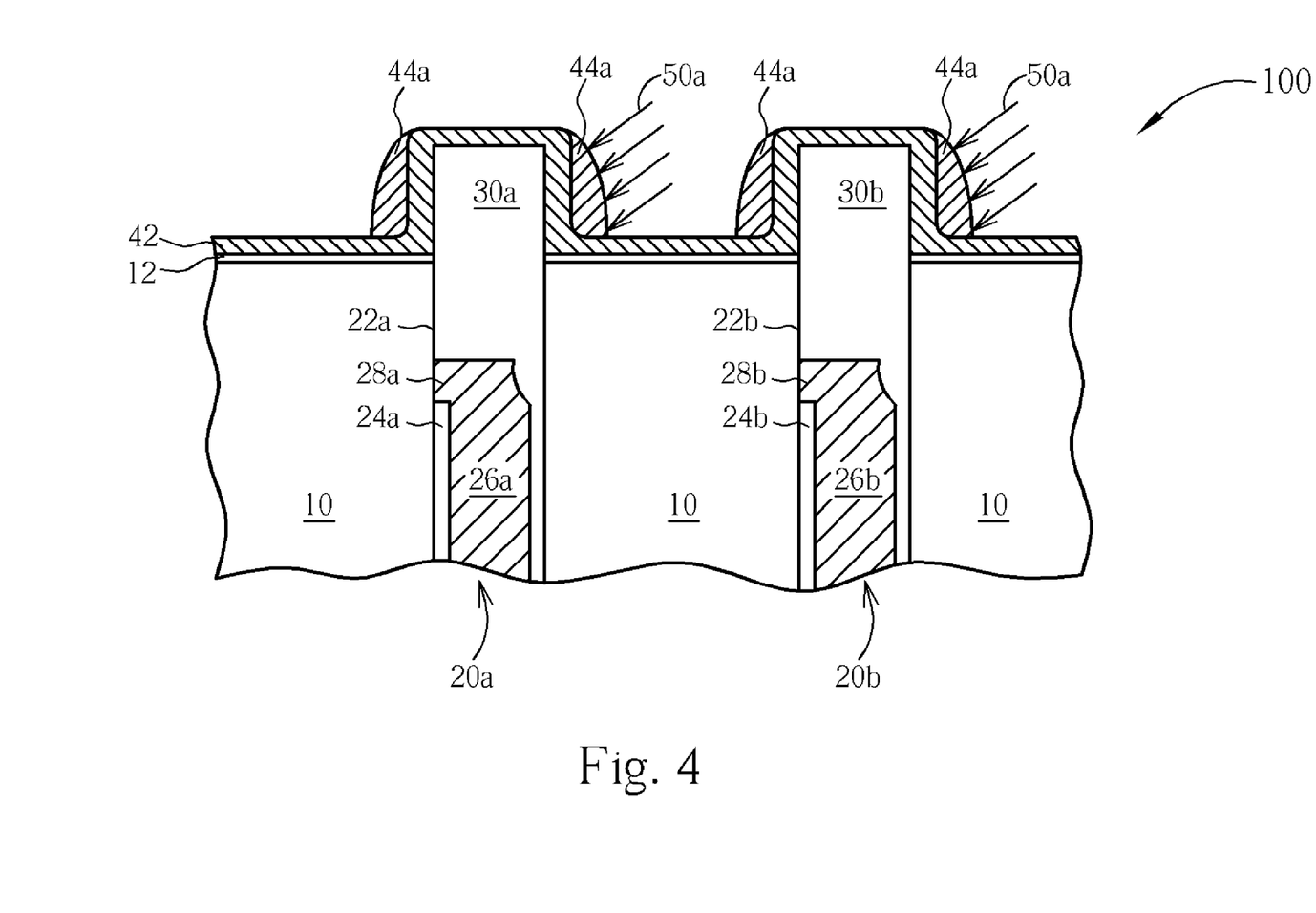

As shown in FIG. 4, an anisotropic dry etching process is then carried out to etch the masking layer 44, thereby forming a masking spacer 44a encircling sidewall of the extruding TTO layers 30a and 30b. A tilt-angle ion implantation process 50a is performed to implant dopants such as $BF_2$, P+, As+, In+, Ar+ and dopants which can cause etching rate selectivity between implanted area and non-implanted area into the masking spacer 44a on one side of the TTO layers 30a and 30b.

Figure 5:
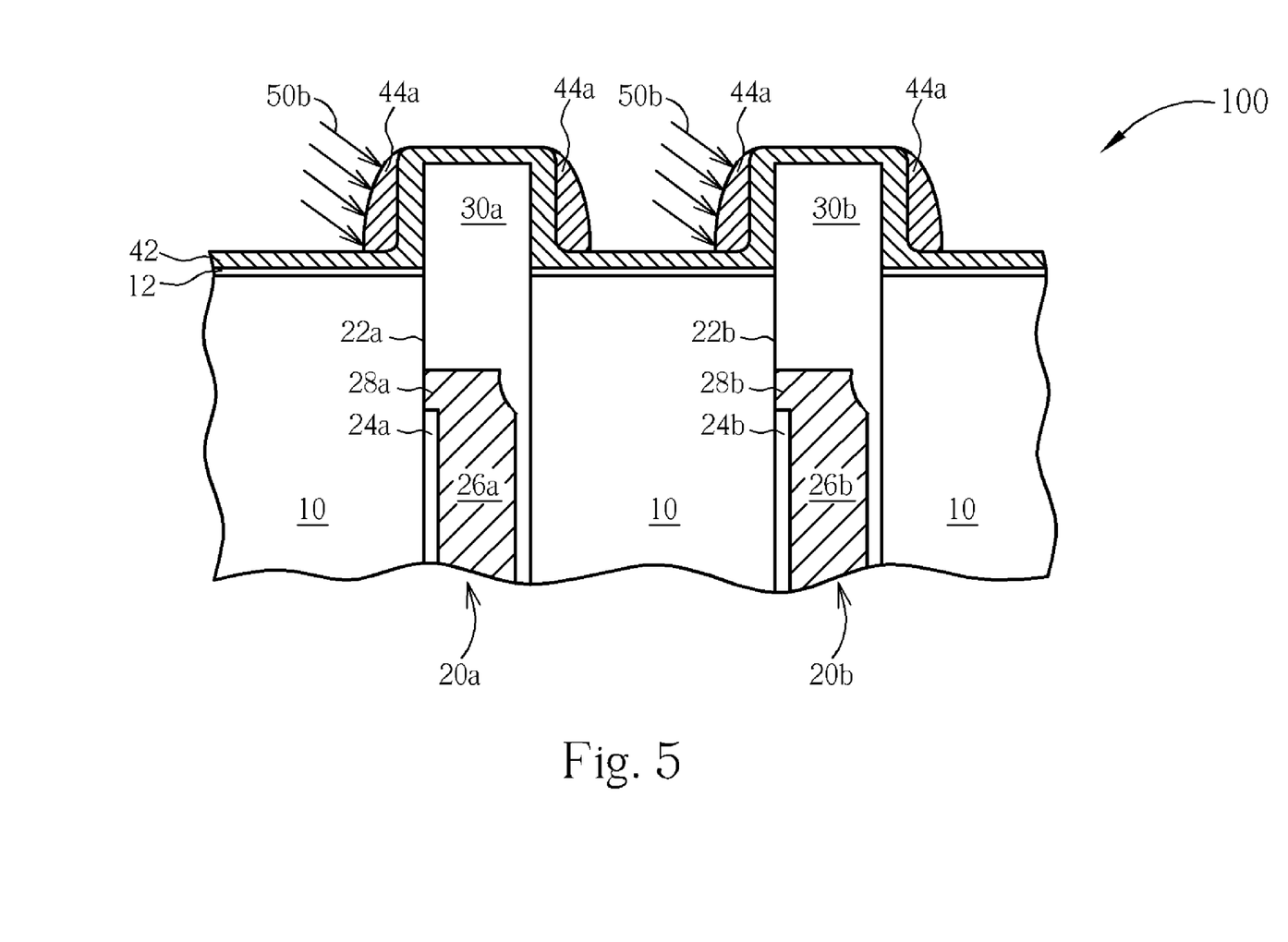

As shown in FIG. 5, another tilt-angle ion implantation process 50b is performed to implant dopants such as $BF_2$ into the masking spacer 44a on the other side of the TTO layers 30a and 30b. The ion implantation direction of the tilt-angle ion implantation process 50a is opposite to the direction of the tilt-angle ion implantation process 50b.

Figure 6:
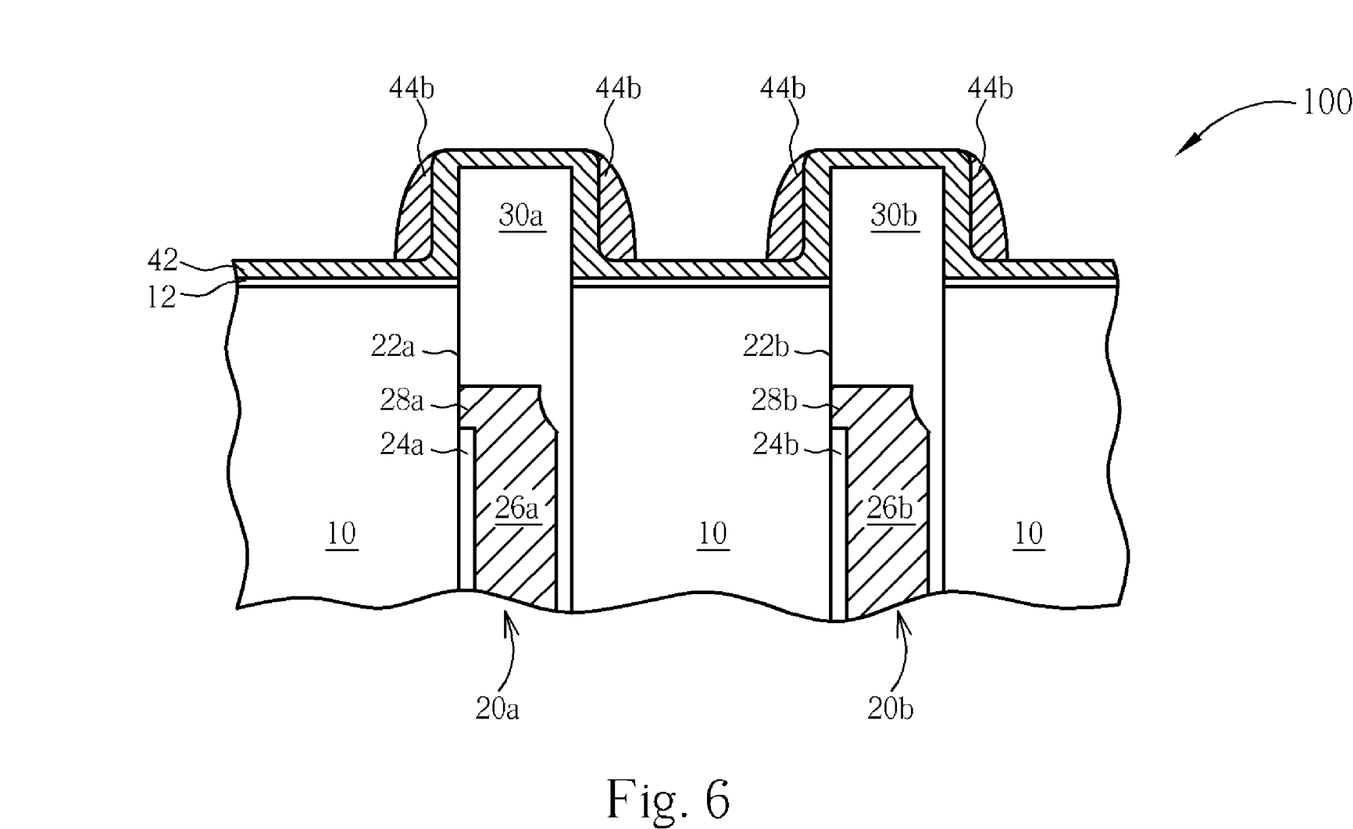

As shown in FIG. 6, the masking spacer 44a is selectively etched. The masking spacer 44a that is not doped with BF2 is removed from the sidewall of the TTO layers 30a and 30b, thereby forming asymmetric single-sided silicon spacer 44b. It is noted that the formation of the symmetric masking spacer 44b should not limited to the method disclosed in the preferred embodiment. The selective etching of the masking spacer 44a may be accomplished by implanting dopants other than $BF_2$.

Figure 7:
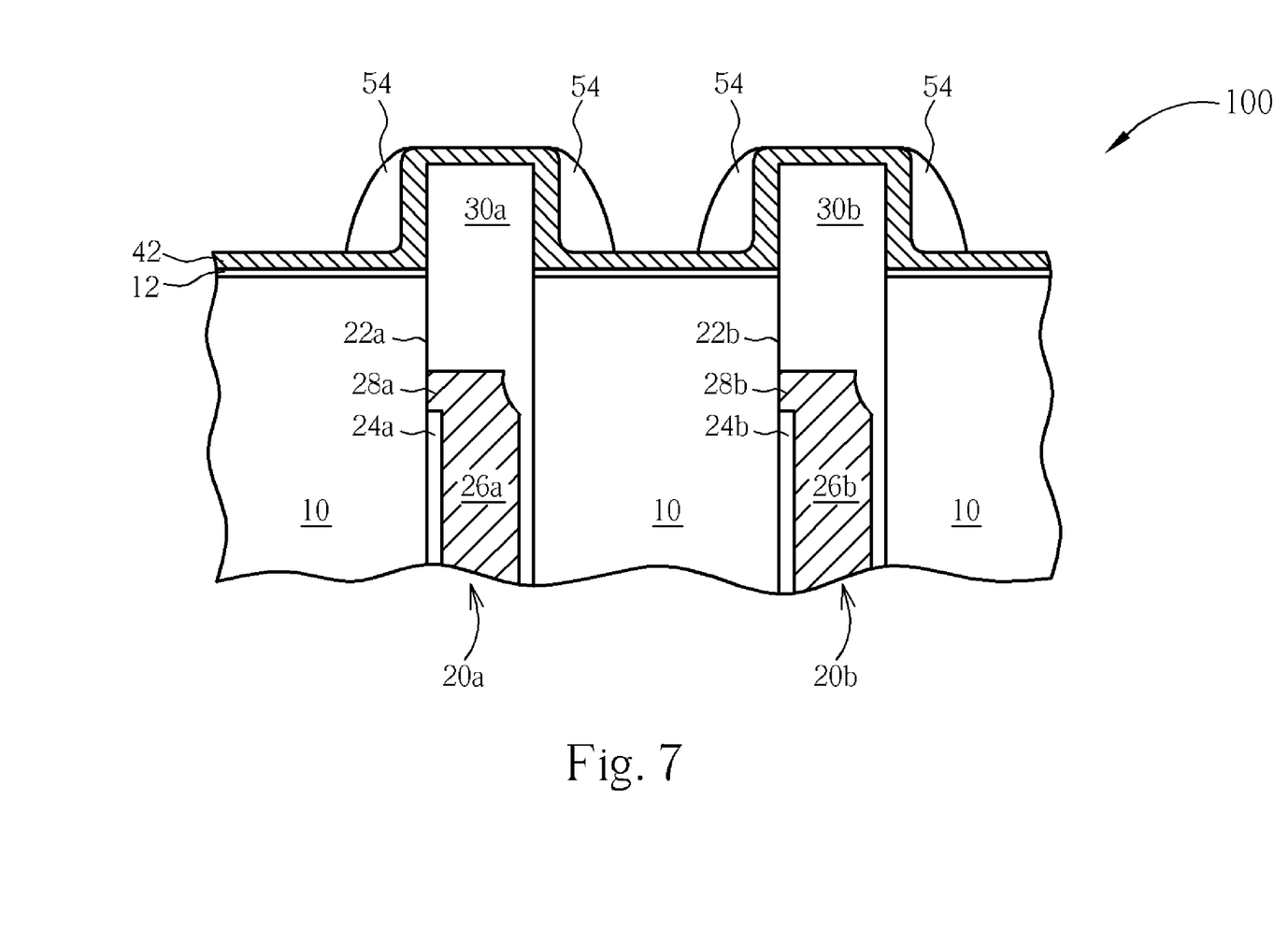

As shown in FIG. 7, an oxidation process is performed to oxidize the masking spacer 44b, thereby forming a silicon oxide spacer 54. The volume of the spacer expands after oxidation. The volume expansion ratio from silicon to oxide is about 1.4 to 1.8.

Figure 8:
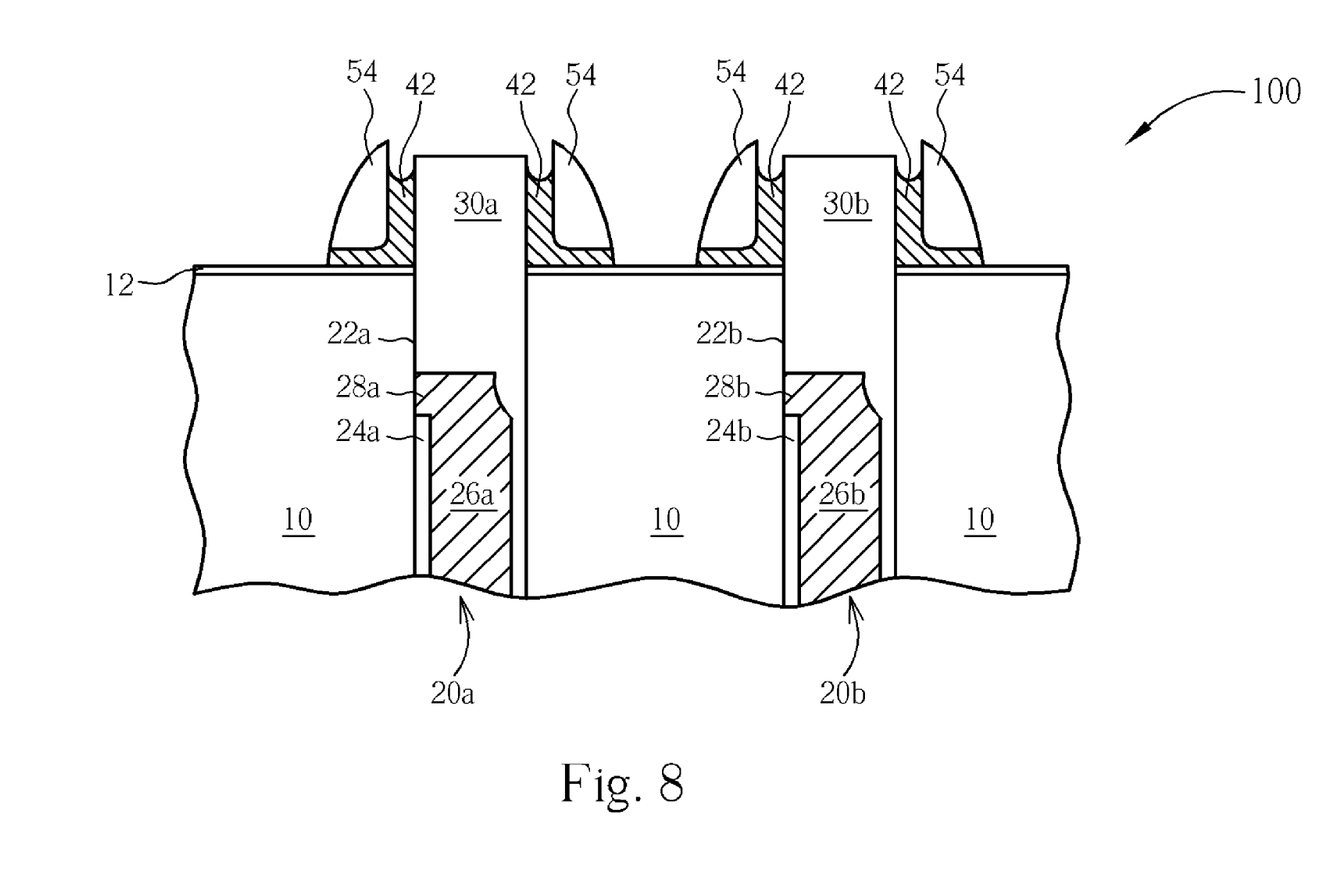

As shown in FIG. 8, an anisotropic dry etching process is carried out. Using the silicon oxide spacer 54 as an etching hard mask, the exposed etching stop layer 42 is first etched until the pad oxide layer 12 and the top surfaces of the TTO layers 30a and 30b are exposed.

Figure 9:
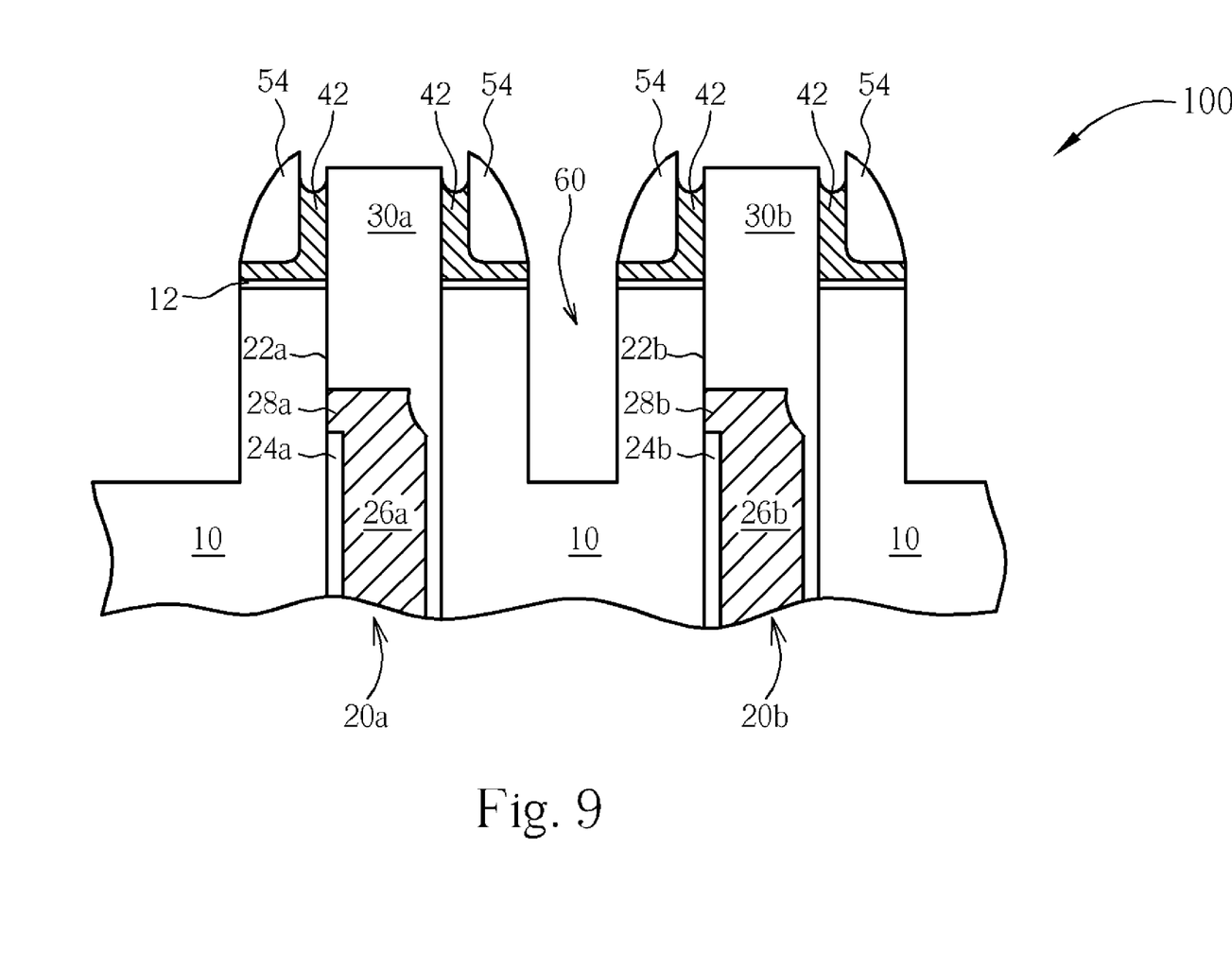

As shown in FIG. 9, another anisotropic dry etching process is then carried out. Using the silicon oxide spacer 54, etching stop layer 42 and the TTO layers 30a and 30b together as an etching hard mask, the semiconductor substrate 10 are etched to a predetermined depth in a self-aligned manner, thereby forming a gate trench 60.

Figure 10:
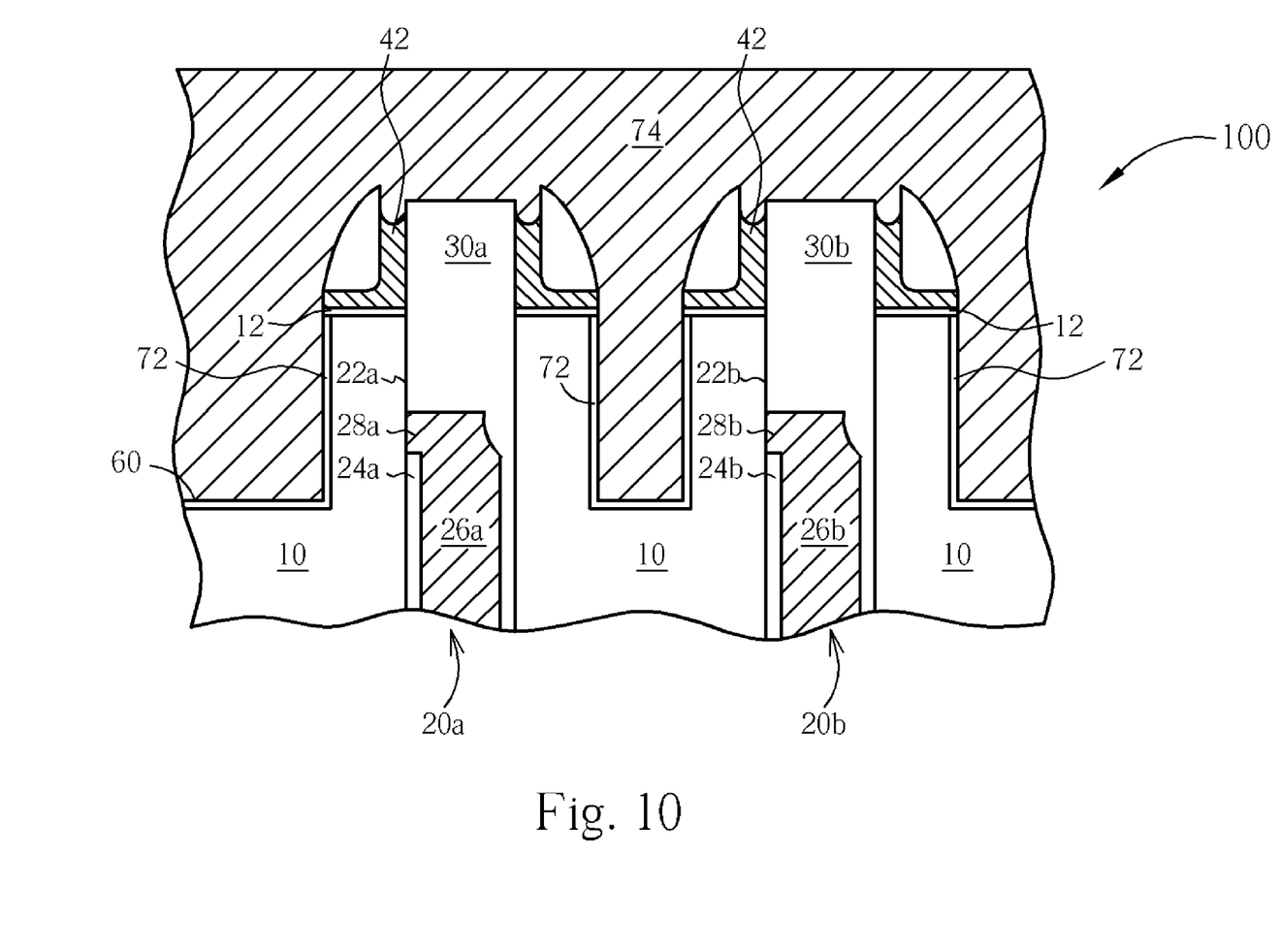

As shown in FIG. 10, a thermal oxidation process or other methods is carried out to form a sacrificing oxide layer 72 on the exposed trench bottom and trench sidewall of the gate trench 60. The sacrificing oxide layer 72 may be replaced with a thin dielectric layer, but not limited to oxide. The thin dielectric layer may be ISSG layer, LP-TEOS layer or ultra-thin SiN layer. The thin dielectric layer facilitates the self-aligned diffusion of dopants into the substrate to form self-aligned source/drain regions. The thin dielectric layer may be removed depending on the requirements of the process. After the formation of the sacrificing oxide layer 72, a CVD process such as a LPCVD or PECVD is performed to deposit a doped polysilicon 74 over the substrate. The gate trench 60 is filled with doped polysilicon 74. The doped polysilicon 74 may be N type doped or P type doped. According to the preferred embodiment, the doped polysilicon 74 is N type doped.

Figure 11:
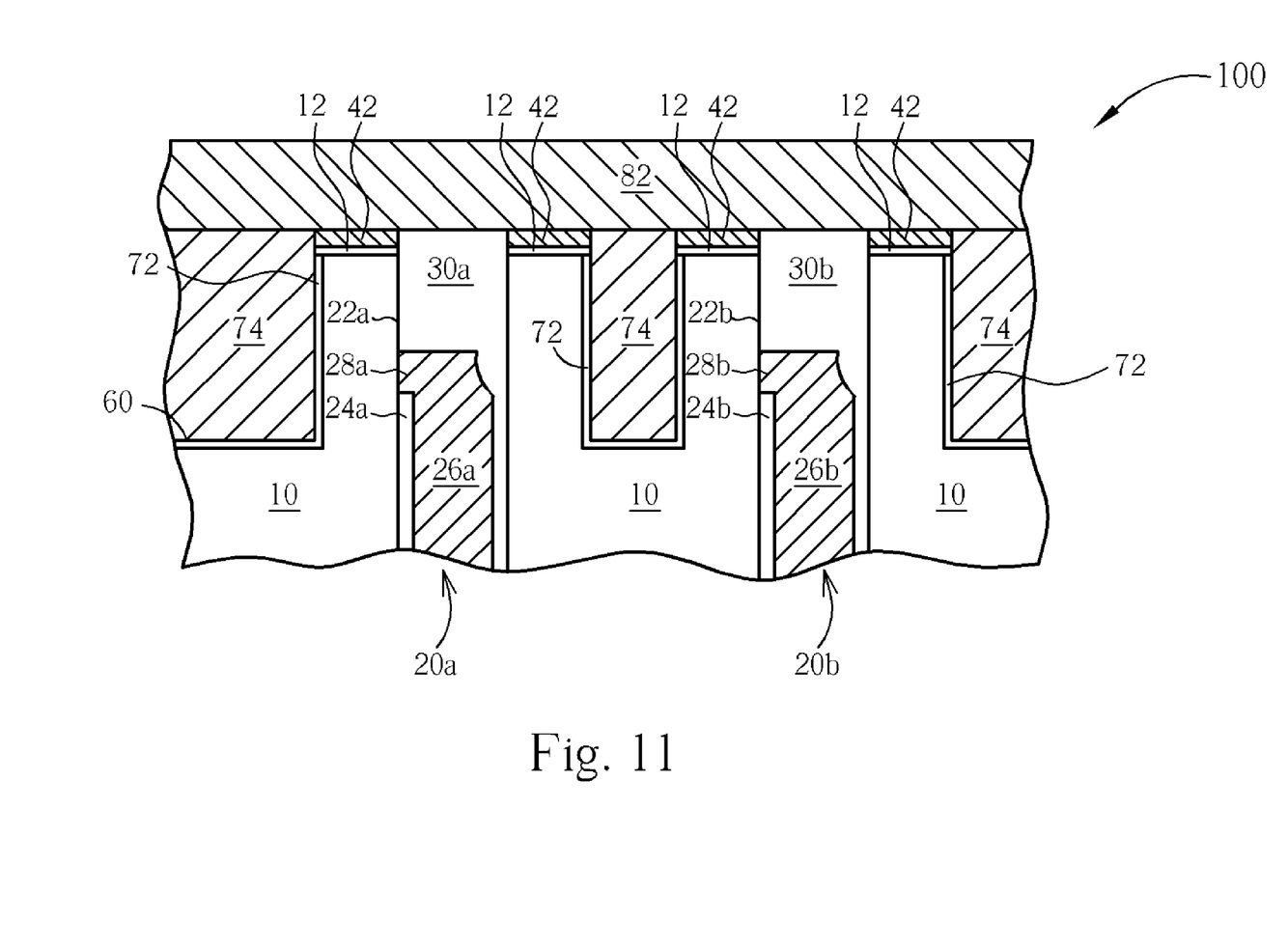

As shown in FIG. 11, a Chemical Mechanical Polishing (CMP) process is performed. Using the etching stop layer 42 as a polishing stop layer, the doped polysilicon 74 is polished and a planarized surface of the substrate is provided. Subsequently, a CVD process such as a LPCVD or PECVD is performed to blanket deposit a silicon nitride layer 82 over the substrate 10.

Next, the following steps are performed to define the active areas within a support circuit region: (1) deposition of a boron doped silicate glass (BSG) layer; (2) deposition of a polysilicon layer; (3) lithographic and etching process for defining the active areas in the support circuit region; (4) oxidation for oxidizing the active areas in the support circuit region; (5) trench filling for the shallow trench isolation and chemical mechanical polishing.

Figure 12:
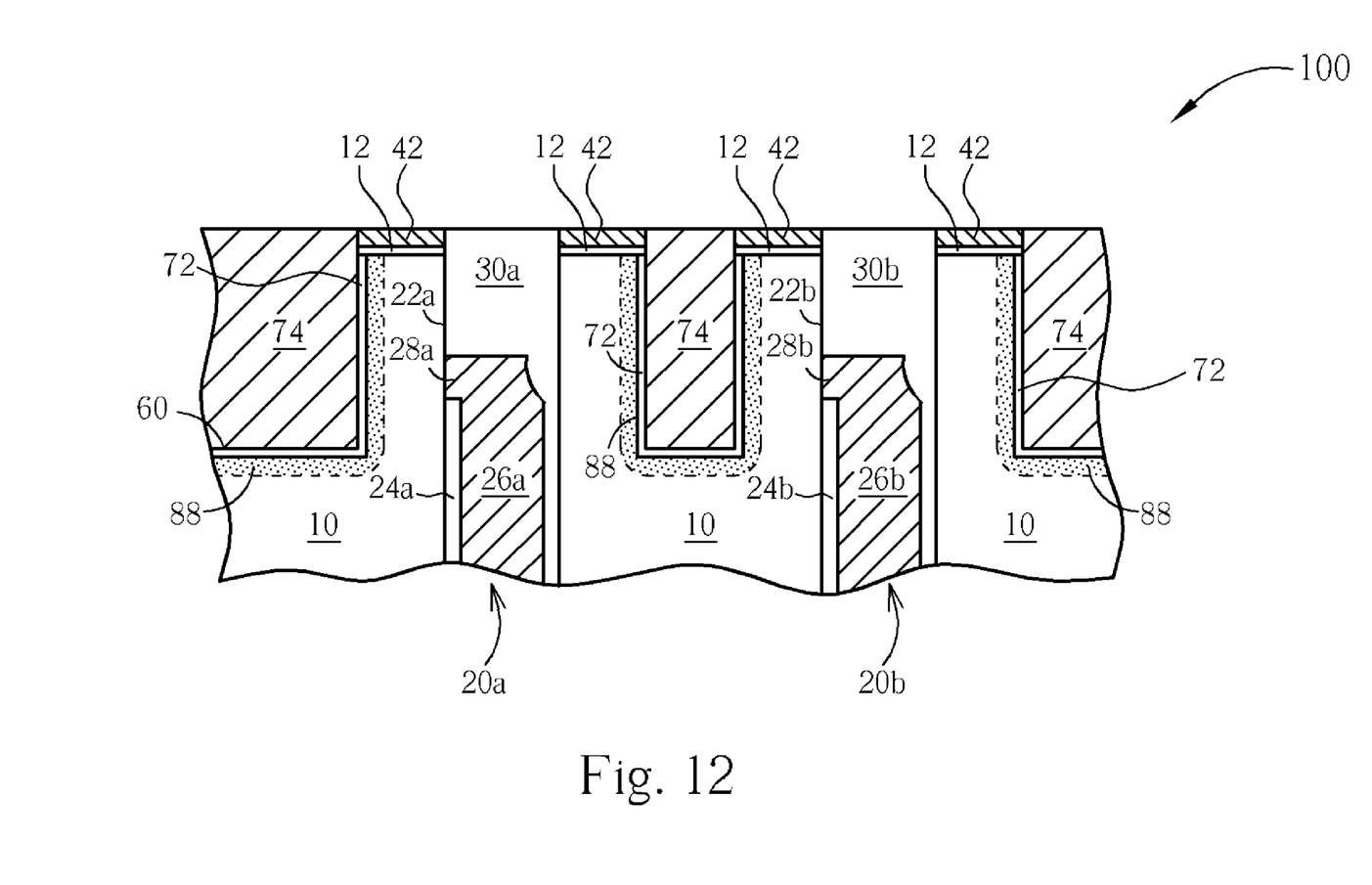

After the definition of the active areas within the support circuit region, a photoresist layer (not shown) is formed to "open" the memory array area 100 while the photoresist layer masks the support circuit region. An etching process is performed to remove the silicon nitride layer 82 from the memory array area 100. It is noted that thermal processes used during the fabrication of the active areas within the support circuit region concurrently make the dopants inside the doped polysilicon layer 74 diffuse out, thereby forming diffusion region 88, as shown in FIG. 12.

Figure 13:
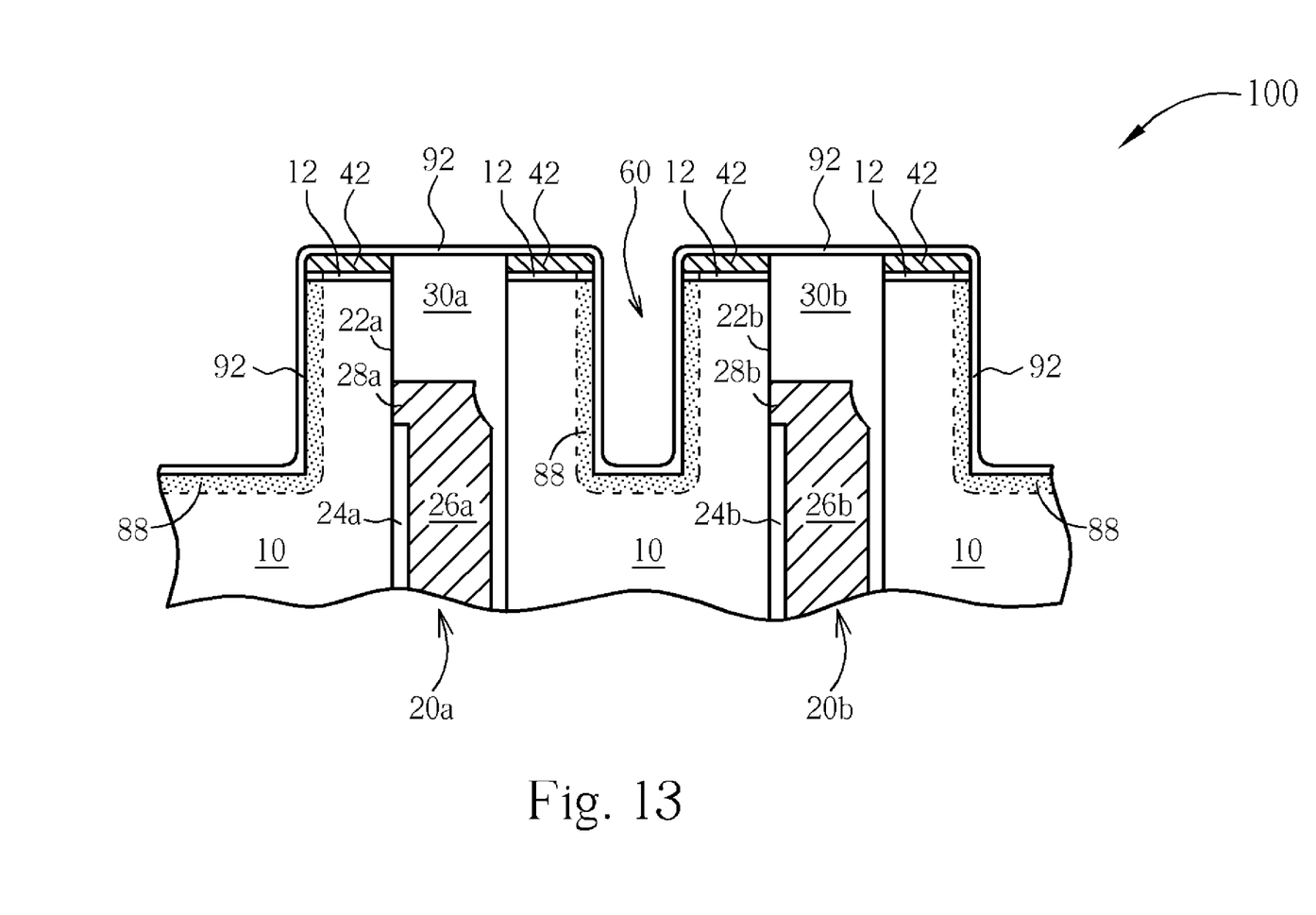

As shown in FIG. 13, the doped polysilicon layer 74 is removed to empty the gate trench 60. Subsequently, the sacrificing oxide layer 72 within the gate trench 60 is removed. A conformal dielectric lining layer 92, preferably oxide, is then deposited on the semiconductor substrate 10. The dielectric lining layer 92 uniformly covers the interior surface of the gate trench 60.

Figure 14:
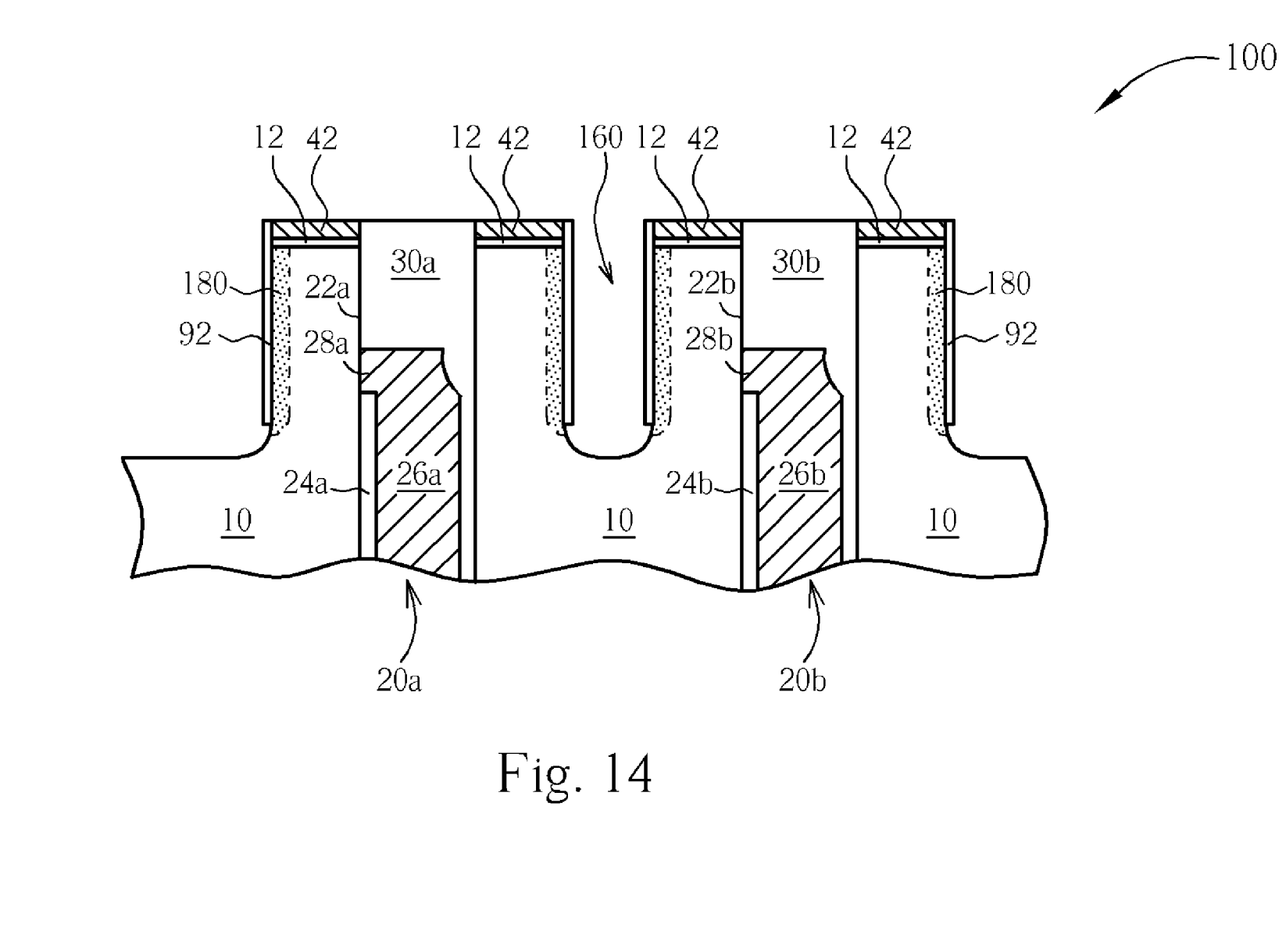

As shown in FIG. 14, an anisotropic dry etching process is performed to etch the dielectric lining layer 92. The dielectric lining layer 92 at the trench bottom is etched through to expose the bottom surface of the gate trench 60. The dry etching continues to etch the exposed bottom surface of the gate trench 60 to a predetermined depth. The predetermined depth has to be deeper than the junction depth of the diffusion region 88 at the bottom of the gate trench 60 in order to split the diffusion region 88 into source/drain regions 180. A slightly deeper gate trench 160 is formed.

Figure 15:
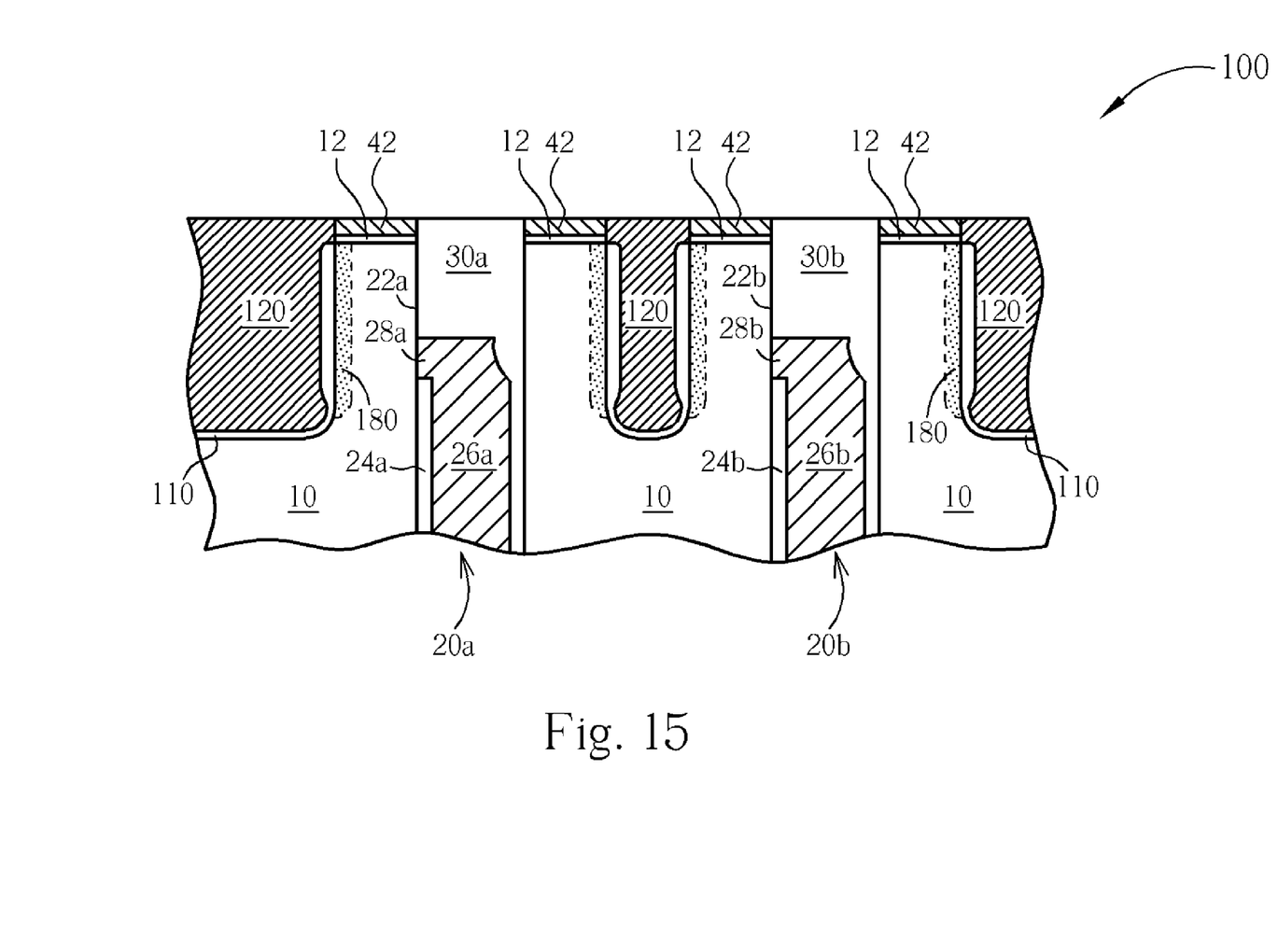

Subsequently, as shown in FIG. 15, a gate oxide layer 110 is formed on the exposed trench bottom and on the sidewall of the gate trench 160 by employing, for example, In-Situ team Growth (ISSG) technology. As specifically indicated, the gate oxide layer 110 on the sidewall of the gate trench 160 is thicker than the gate oxide layer 110 at the trench bottom because of the dielectric lining layer 92. The thicker oxide on the sidewall of the gate trench 160 can reduce the capacitance between the gate and the source/drain regions 180, thereby improving the performance of the MOS transistor device.

The thicker gate oxide layer is located on the sidewall of the gate trench 160, but not limited to the sidewall. Depending on the practical needs of the device, the thicker gate oxide layer may cover the a portion of the sidewall of the gate trench 160, the entire sidewall of the gate trench 160 or also cover a portion of the trench bottom.

Finally, the gate trench 160 is filled with conductive gate material 120 such as doped polysilicon. After the deposition of the doped polysilicon, a CMP process is carried out to remove excess conductive gate material 120 outside the gate trench 160.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A recessed gate MOS transistor device, comprising:
    a substrate having thereon a gate trench, wherein the gate trench has a sidewall and a bottom surface;
    a source diffusion region disposed on the sidewall of the gate trench;
    a drain diffusion region disposed on the sidewall of the gate trench opposite to the source diffusion region;
    a gate channel region being situated at the bottom surface of the gate trench and between the source diffusion region and the drain diffusion region;
    a gate oxide layer formed on the sidewall and bottom surface of the gate trench, wherein the gate oxide layer has a first thickness at the sidewall of the gate trench and has a second thickness at the bottom surface of the gate trench, and wherein the first thickness is not equal to the second thickness, wherein both of the source and drain diffusion regions extend along the sidewall of the gate trench and reach the gate oxide layer of the second thickness; and
    a gate conductor inlaid in the gate trench.

2. The recessed gate MOS transistor device of claim 1 wherein the first thickness is greater than the second thickness.

3. The recessed gate MOS transistor device of claim 1 wherein the gate conductor comprises doped polysilicon.

* * * * *